United States Patent [19]

Olson et al.

[11] Patent Number: 5,705,433
[45] Date of Patent: Jan. 6, 1998

[54] ETCHING SILICON-CONTAINING MATERIALS BY USE OF SILICON-CONTAINING COMPOUNDS

[75] Inventors: Dale A. Olson, Sunnyvale; Xue-Yu Qian, Milpitas; Patty Hui-ing Tsai, San Jose, all of Calif.

[73] Assignee: Applied Materials, Inc., Santa Clara, Calif.

[21] Appl. No.: 518,937

[22] Filed: Aug. 24, 1995

[51] Int. Cl.$^6$ .................................. H01L 21/469
[52] U.S. Cl. ................. 437/233; 156/643.1; 156/646.1; 156/650.1; 156/657.1
[58] Field of Search ................ 437/233; 156/646.1, 156/650.1, 662.1, 643.1, 657.1

[56] References Cited

U.S. PATENT DOCUMENTS

| 4,411,734 | 10/1983 | Maa | 156/643 |
|---|---|---|---|
| 4,778,563 | 10/1988 | Stone | 156/643 |
| 5,007,982 | 4/1991 | Tsou | 156/643 |
| 5,242,536 | 9/1993 | Schoenborn | 156/643 |
| 5,310,456 | 5/1994 | Kadomura | 156/657 |
| 5,314,576 | 5/1994 | Kadomura | 156/655 |
| 5,354,421 | 10/1994 | Tatsumi et al. | 156/662 |
| 5,368,686 | 11/1994 | Tatsumi et al. | 156/656 |
| 5,436,424 | 7/1995 | Nakayama et al. | 219/121.43 |

*Primary Examiner*—John Niebling
*Assistant Examiner*—Long Pham
*Attorney, Agent, or Firm*—James Wilson; Birgit E. Morris

[57] ABSTRACT

During the etching of a silicon-containing material using a halogen-containing etch gas, a silicon-hydride gas is added to the etch gas to provide increased sidewall protection during the etch. Suitably up to about 50 percent by volume of a silicon-containing gas such as silane is added to improve anisotropy of the etch and to prevent notching at the silicon-substrate interface.

10 Claims, 3 Drawing Sheets

ETCHING SILICON-CONTAINING MATERIALS BY USE OF SILICON-CONTAINING COMPOUNDS

This invention relates to an etch process for silicon-containing materials. More particularly, this invention relates to an etch process for silicon-containing materials that is highly anisotropic.

BACKGROUND OF THE INVENTION

In the manufacture of semiconductor devices such as transistors on a substrate such as a silicon wafer, silicon lines are needed to form the transistor gates. Silicon gates are made by depositing a polysilicon layer over a dielectric silicon oxide layer (the gate oxide). An additional metal silicide layer may also be added to reduce the resistivity of the interconnect. These layers are then etched so as to leave conductive polysilicon or polycide lines on the silicon oxide dielectric.

Many important device performance parameters are sensitive functions of transistor channel length for smaller devices. As a consequence, the physical dimensions of the etched polysilicon and polycide lines are critical, as the channel length of the transistors depends on the width of these lines. In order to maintain high device yield, precise control of the polysilicon and polycide linewidth is required. This control can be achieved by maintaining vertical sidewall profiles (anisotropic profiles) for all etched lines on the substrate, regardless of position or local environment (low profile microloading). An additional strict requirement is imposed by the gate oxide layer. To achieve high device densities while maintaining necessary electrical characteristics, thinner gate oxides are required. As a consequence of the reduced thickness, high selectivity of silicon to silicon oxide is required by the etch process to avoid erosion of the gate oxide layer. Generally the polysilicon and polycide lines have been etched in a plasma of a halogen gas, such as a chlorine-containing gas, a fluorine-containing gas, a bromine-containing gas, or mixtures of halogen-containing gases. Plasma etching can produce anisotropic profiles while maintaining high selectivity, and plasma etching of silicon-containing materials is now widely used.

Conventional plasma etch processes however have several problems; some isotropic etching takes place, causing an inward bowing of the lines, causing negatively sloped, or re-entrant sidewalls, and causing notching at the interfaces between the silicide and polysilicon layers as well as between the polysilicon lines and the silicon oxide layer.

When the polysilicon lines are required to be less than one-half micron in width, high density plasmas with independent plasma generation and ion energy control have been used. These etchers generally operate under high ion current and low ion energy conditions. The pressure in these chambers is also lower than conventional etching, in the range of 1 to 50 millitorr. These conditions, while producing vertical profiles, high selectivity and low profile microloading, result in reduced passivation of the polysilicon and/or polycide sidewalls during the entire etch process. The reduced passivation can lead to the undesirable sidewall features including linewidth loss, bowing and notching.

After a polysilicon or polycide line has been etched down to the silicon oxide layer, which is known as the main etch step, i.e., the etch endpoint has been reached, an overetch step is performed to remove any remaining silicon material on the exposed silicon oxide substrate. This overetch step is used to remove "stringers" and other silicon-containing material still remaining. The overetch is even more sensitive to sidewall attack than the main etch. During the main etch, the silicon-containing reaction byproducts of the polysilicon and silicon oxide removal may deposit on the polysilicon/ polycide sidewalls to provide protection from lateral (isotropic) etching. Since the overetch conditions are chosen so that selectivity between the silicon-containing material being etched and the underlying layer material is high, and only the stringers remain from the initial layer, very little silicon-containing material is being removed during the overetch step, and the protective reaction by-products that deposited on the sidewalls during the main etch step are being formed only in very small amounts. Thus very little sidewall protection is available during the overetch step, with the result that lateral etching occurs. This lateral etching results in unsatisfactory profiles, including bowing, notching and line width loss. Such a sidewall is seen in FIG. 1, wherein the problems are seen slightly exaggerated. As shown in FIG. 1A, in a typical etched polysilicon line 12, there is a notch 14 at the interface between the polysilicon layer 12 and the substrate 16. As shown in FIG. 1B, bowing of the polysilicon sidewall is shown at 18. FIG. 1C illustrates linewidth loss at 20.

When the polysilicon line 12 is to be encapsulated, e.g., with a dielectric such as silicon oxide or silicon nitride, voids will be formed at the notch 14, and along the bowed sidewall 18. In addition, precise control of the linewidth is not possible because of the lateral etching.

Thus the search for an improved process that provides improved protection of the sidewall during etching, during both the main etch and the overetch, to produce straight sidewalls and eliminate notching has continued.

SUMMARY OF THE INVENTION

We have found that by adding silicon-hydride compounds to the etch gas during plasma etching of silicon-containing materials, improved sidewall protection is obtained, the etched silicon-containing lines have straight walls, and notching is eliminated or reduced.

The added silicon hydride compound provides additional silicon-containing compounds that deposit on the sidewalls during etching, particularly during the overetch step, when very small amounts of materials are being removed from the substrate. These protective silicon-hydride compounds prevent lateral etching of the sidewalls and provide increased protection to the sidewalls.

DETAILED DESCRIPTION OF THE INVENTION

In accordance with the present process, a silicon-hydride compound is added to conventional etchants for silicon-containing materials.

Silicon-containing materials include doped or undoped polysilicon, refractory metal silicides including tantalum silicide, titanium silicide, tungsten silicide, molybdenum silicide and the like, as well as polycide stacks of refractory metal silicides over polysilicon.

Suitable gaseous silicon-hydride compounds that can be added to an etch gas include silane ($SiH_4$) and higher silanes, dichlorosilane ($SiH_2Cl_2$), difluorosilane ($SiH_2F_2$) and the like. Other, liquid silicon-containing compounds such as hexamethyldisilazane (HMDS) can be added using a liquid source apparatus.

Although the exact reason for the improved sidewall protection of the present invention is not known, it is believed that the silicon combines with other etchant and product species to form various materials with low enough vapor pressure to condense on the substrate. These reaction products deposit on the sidewalls, protecting them from lateral etching, particularly at the interfaces between the different silicon-containing materials being etched and the dielectric underlayer, preventing the formation of notches. Because these silicon-containing additives are provided to the etch process independently, rather than as an etch by-product, the amount of sidewall passivation can be controlled in the process recipe, facilitating precise control of lateral etching.

During the silicon-hydride material etch process, the silicon-containing lines or other features are formed by etching the silicon-containing material as above using a halogen gas. Various halogen etch gases and etch gas mixtures are well known to one skilled in the art. This etch process produces various silicon species such as $SiCl$, $SiCl_2$, $SiF$, $SiF_2$, $SiBr$ and other silicon-containing compounds, that deposit on the silicon sidewalls and provide protection from lateral etching. However, generally etching is continued after the substrate is reached, during the overetch step, to remove the last of the silicon-containing layer adjacent to the substrate. This overetch step requires high selectivity of the etch between the polysilicon or silicide and the substrate, generally of silicon oxide, so that the substrate is not etched or damaged during the overetch step. During this overetch step, very little silicon oxide is etched, and only a small amount of silicon is still present that is to be removed. Since only a small amount of silicon is still present, the amount of silicon-containing by-product species formed is insufficient to protect the sidewalls, and the etch gas attacks the sidewalls as well as the remaining silicon, causing bowing of the sidewalls and notching at the silicon-silicon oxide (or silicide-silicon) interface.

Figure 1A:
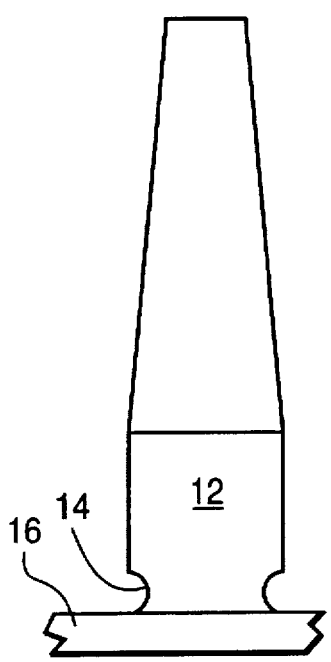
FIG. 1A is a cross sectional view of a prior art silicon line illustrating a notch.
Figure 1B:
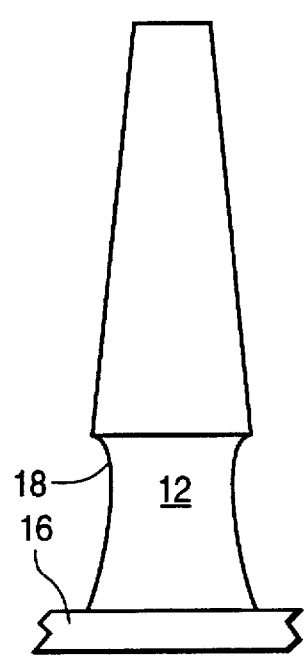
FIG. 1B is a cross sectional view of a prior art silicon line illustrating a bowed sidewall.
Figure 1C:
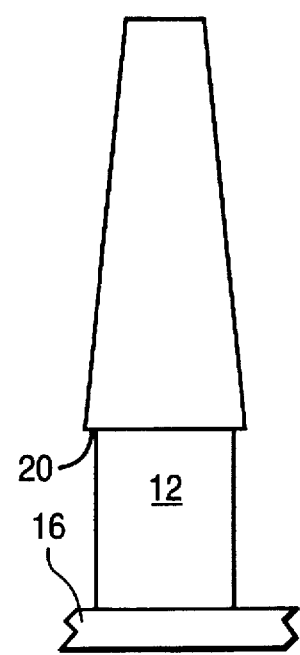
FIG. 1C is a cross sectional view of a prior art silicon line illustrating a loss in linewidth.
Figure 2:
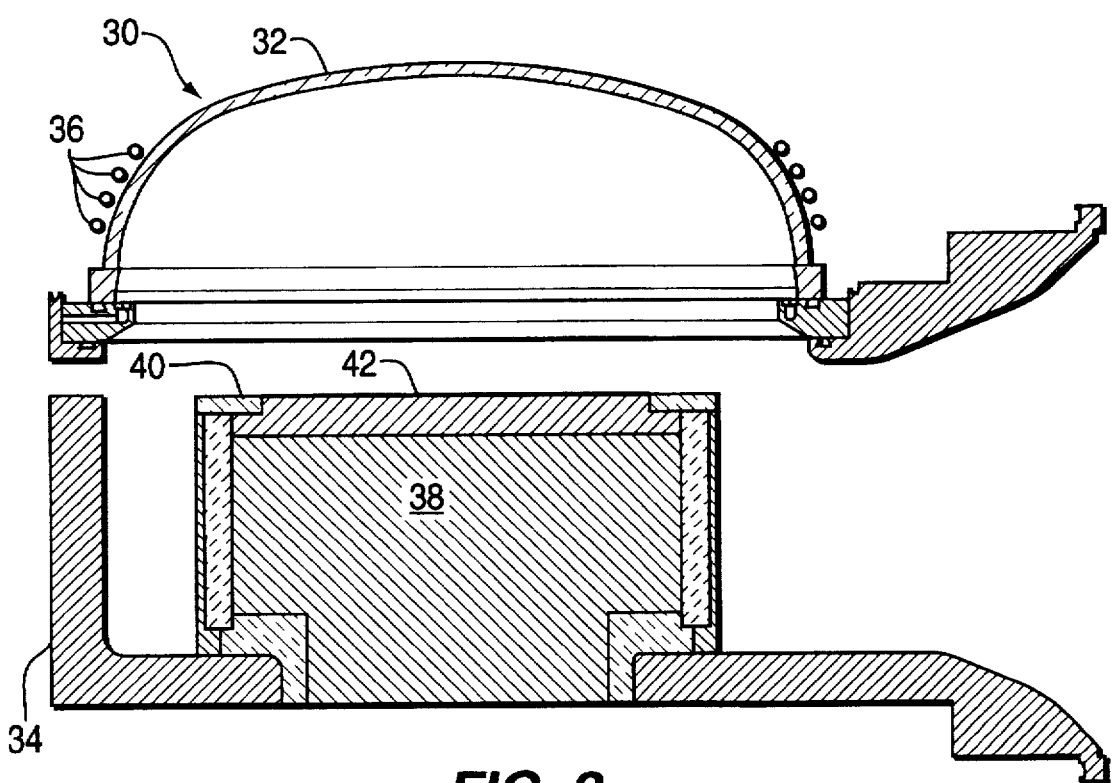
FIG. 2 is a cross sectional view of a reaction chamber suitable for use herein.

A suitable etch reactor for carrying out the present process is shown schematically in FIG. 2. The reactor 30 includes a dome-shaped cover 32 that seals to the bottom of the chamber 34. A coil 36 surrounds the cover 32 and is the source that provides power to the reactor 30. The chamber 34 includes an electrode support 38 and pedestal 40 that supports a wafer 42 to be processed in the chamber 34. Other conventional etch reactors can be substituted and the invention is not limited to any particular type of etch reactor.

Suitable etch conditions for the reactor of FIG. 2 are given below:

| | |
|---|---|
| Pressure | 1–50 millitorr |
| Total Gas Flow | 50–300 sccm |
| Cathode temperature | −40–+70° C. |
| Power (12.56MHz) on the cathode | 20–200 Watts |
| Power (13.56MHz on the source | 300–3000 Watts |

Under these conditions, the etch rate is about 4000 Å/min.

The invention will be further described in the following examples, but the invention is not to be limited to the details described therein.

EXAMPLE 1

The reaction chamber of FIG. 2 was used to etch 0.5 micron tungsten silicide/polysilicon lines over a silicon oxide layer on a silicon wafer. The chamber pressure was 4 millitorr. The etch gas included 16 sccm of silane, 184 sccm of chlorine and 4.2 sccm of oxygen. The power source was operated at 700 watts, 100 watts of bias was placed on the cathode, and the temperature was maintained at 35° C.

Figure 3A:
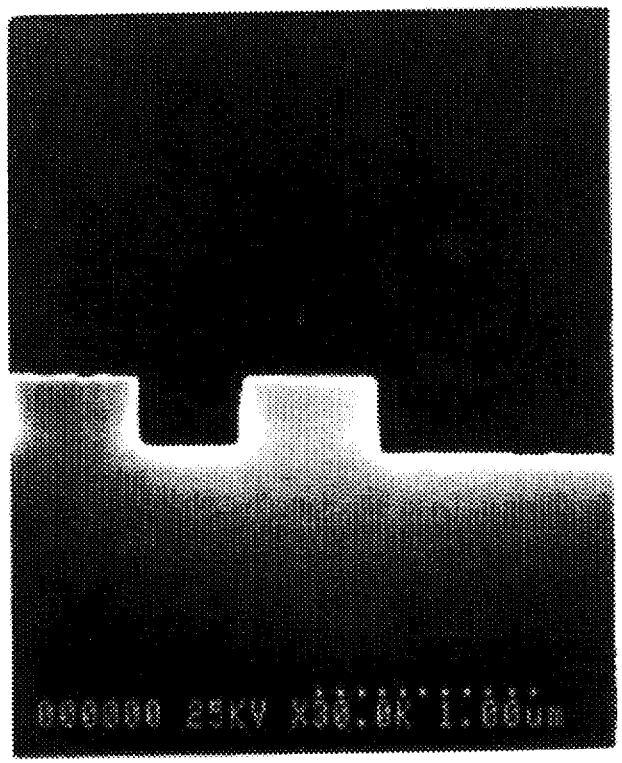
FIGS. 3A and 3B are cross sectional views of etched polycide profiles without and with the additional of silane in the etch gas respectively.
Figure 3B:
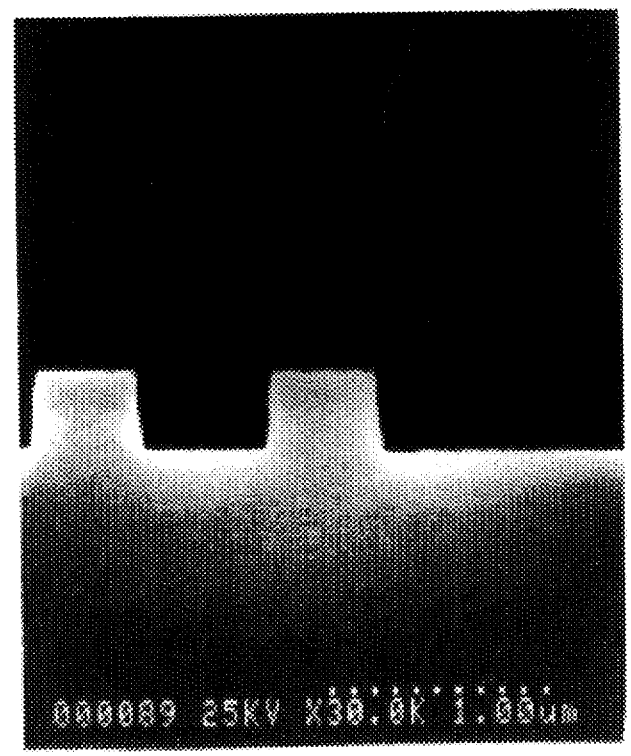

The effects of the addition of silane to the main etch gas mixture can clearly be seen in FIGS. 3A and 3B. When no silane was added to the process, bowing of the polycide sidewalls is apparent (FIG. 3A). However, when 16 sccm of silane was added to the main etch process, the etch rate was reduced to 3000 Å/min, but no bowing of the sidewalls occurred, as can be seen in FIG. 3B.

EXAMPLE 2

Polysilicon was etched using 96 sccm of chlorine, 24 sccm of HBr, and 6 sccm of a helium-oxygen mixture. This helium-oxygen mixture contained 70% of helium. The polysilicon was etched to endpoint at a rate of 4000 Å/min. Thereafter the wafer was overetched for a time equivalent to the removal of 2000 Å of polysilicon to ensure removal of all polysilicon adjacent to the substrate. The etch rate was reduced to 3400 Å/min during the overetch step.

Figure 4A:
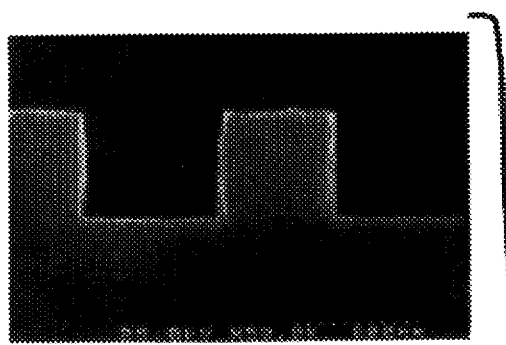
FIG. 4A, 4B and 4C are cross sectional views of etched polycide profiles without the addition of silane in the etch gas, with 4% by volume of silane added and with 8% by volume of silane added, respectively.
Figure 4A:
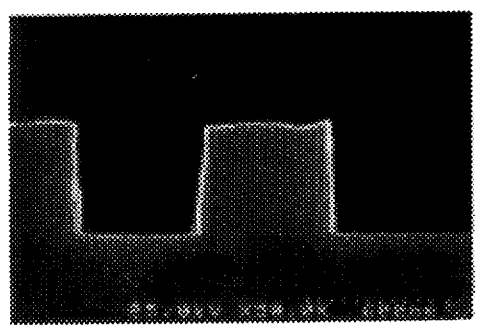

When no silicon-hydride gas was added, as shown in FIG. 4A, notching can be seen at the polysilicon/substrate interface.

Figure 4B:
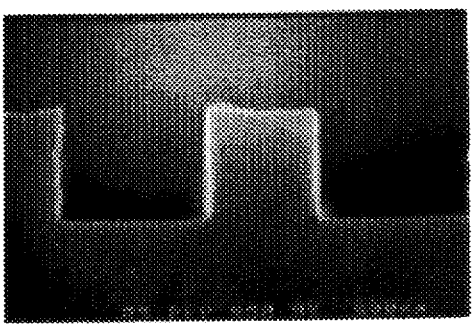

When 4% by volume of silane was added to the etch gas however, as shown in FIG. 4B, notching was eliminated and the polysilicon lines have straight sidewalls.

Figure 4C:
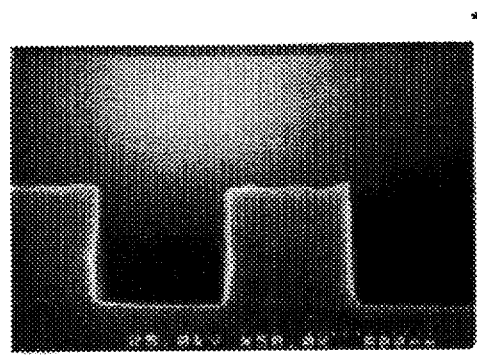
Figure 4C:
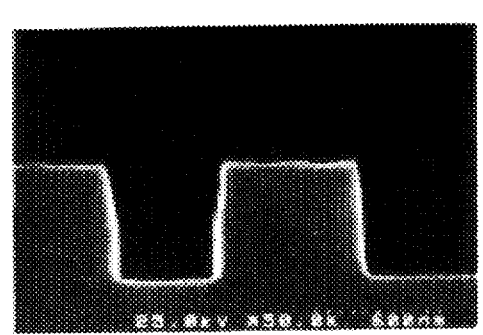

When 8% by volume of silane was added to the etch gas, as shown in FIG. 4C, no notching occurred and the protective sidewall deposit can clearly be seen.

Various changes to the silicon-containing materials to be etched, the etch gases, reactor conditions and the gaseous silicon hydride additive employed can be made, as well as changes to the relative amounts of the reagents, as will be known to one skilled in the art, and are meant to be included herein. The invention is meant to be limited only by the scope of the appended claims.

We claim:

1. In a process for anisotropically etching openings in silicon-containing materials with a halogen etch gas selected from the group consisting of a halogen and a hydrogen halide, the improvement comprising adding a silicon-hydride gas to the etch gas, thereby depositing a protective silicon-containing layer on etched sidewalls of said openings.

2. A process according to claim 1 wherein the silicon-containing material is polysilicon.

3. A process according to claim 1 wherein the silicon-containing material is a refractory metal silicide.

4. A process according to claim 1 wherein the silicon-containing material is a refractory metal silicide-polysilicon stack.

5. A process according to claim 1 wherein the silicon-hydride gas is silane ($SiH_4$).

6. A process according to claim 1 wherein the silicon-hydride gas is added during a main etch step.

7. A process according to claim 1 wherein the silicon-hydride gas is added during an overetch step.

8. A process according to claim 1 wherein the etch gas includes chlorine.

9. A process according to claim 1 wherein the etch gas is a mixture including chlorine and hydrogen bromide.

10. A process according to claim 1 wherein the silicon-hydride gas is added to the etch gas in amounts up to 50 percent by volume.

* * * * *